(12) United States Patent
Oue et al.

(10) Patent No.: US 7,521,734 B2
(45) Date of Patent: Apr. 21, 2009

(54) SEMICONDUCTOR DEVICE WITH REDUCED BASE RESISTANCE

(75) Inventors: Eiji Oue, Mobara (JP); Katsuyoshi Washio, Tokorozawa (JP); Hiromi Shimamoto, Iruma (JP); Katsuya Oda, Hachioji (JP); Makoto Miura, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/855,378

(22) Filed: May 28, 2004

(65) Prior Publication Data

US 2005/0001238 A1 Jan. 6, 2005

(30) Foreign Application Priority Data

Jul. 3, 2003 (JP) ............................ 2003-190752

(51) Int. Cl.
| H01L 31/0328 | (2006.01) |
| H01L 31/0336 | (2006.01) |
| H01L 31/072 | (2006.01) |
| H01L 31/109 | (2006.01) |

(52) U.S. Cl. ............................. 257/197; 257/E21.371
(58) Field of Classification Search ................. 257/197, 257/E21.371
See application file for complete search history.

(56) References Cited

U.S. PATENT DOCUMENTS

| 5,962,880 | A | * | 10/1999 | Oda et al. | .................... 257/198 |
| 6,482,710 | B2 | * | 11/2002 | Oda et al. | .................... 438/311 |
| 6,509,242 | B2 | * | 1/2003 | Frei et al. | .................... 438/312 |
| 6,699,741 | B1 | * | 3/2004 | Sadovnikov et al. | ........ 438/197 |

FOREIGN PATENT DOCUMENTS

| JP | 10-079394 | 3/1998 |
| JP | 10-092837 | 4/1998 |

* cited by examiner

*Primary Examiner*—Howard Weiss
(74) *Attorney, Agent, or Firm*—Antonelli, Terry, Stout & Kraus, LLP.

(57) ABSTRACT

A bipolar transistor is provided in which both the base resistance and the base-collector capacitance are reduced and which is capable of operating at a high cutoff frequency. The semiconductor device is structured so that the emitter and extrinsic base are separated from each other by an insulator sidewall and the bottom faces of the insulator sidewall, and the emitter are approximately on the same plane. The extrinsic base electrode and the collector region are separated from each other by an insulator.

8 Claims, 10 Drawing Sheets

SEMICONDUCTOR DEVICE WITH REDUCED BASE RESISTANCE

CLAIM OF PRIORITY

The present application claims priority from Japanese application JP-2000-190752, filed on Jul. 3, 2003, the content of which is hereby incorporated by reference into this application.

FIELD OF THE INVENTION

The present invention relates to a semiconductor device, and, more particularly, it relates to a very fast operation bipolar semiconductor device.

BACKGROUND OF THE INVENTION

Figure 2:
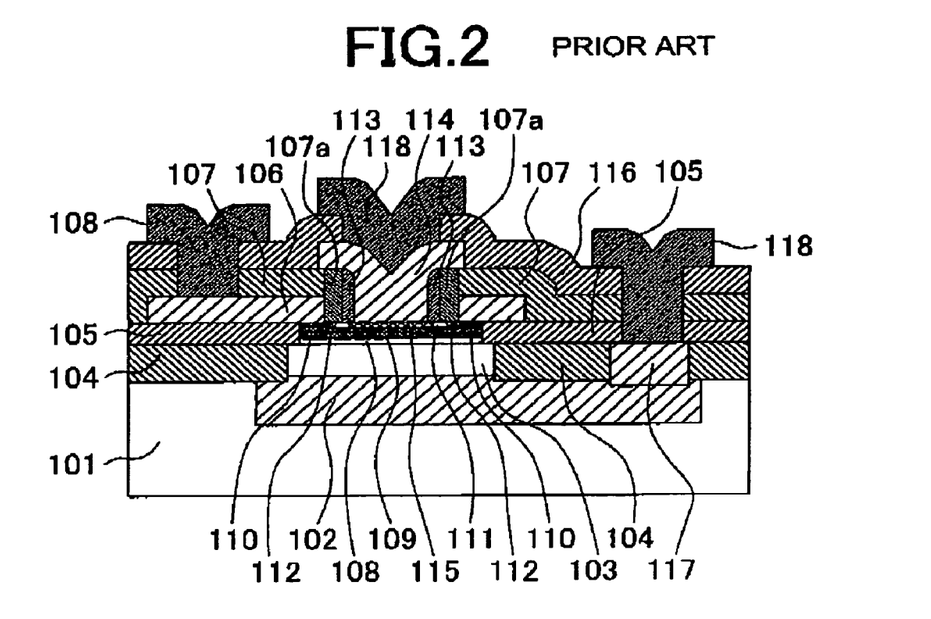
FIG. 2 is a cross sectional view of a bipolar transistor representing a first conventional example.

A bipolar transistor, which is formed through silicon selective epitaxial growth and operates as a fast operation bipolar transistor, is disclosed in JP-A 79394/1998. (the term "JP-A" as used herein designates an "unexamined published Japanese patent application"). Hereinafter, an example will be described which is referred to as conventional example 1. FIG. 2 shows a cross sectional view of a bipolar transistor constituting the conventional example 1. In FIG. 2, reference numerals and symbols are defined as follows; 101 denotes a silicon substrate, 102 denotes a high concentration n-type buried layer, 103 denotes a low concentration n-type buried layer (single crystal silicon), 104 denotes a trench isolation, 105 denotes a collector-base isolation film, 106 denotes an extrinsic base electrode, each of 107, 107a, 113, and 116 denotes an emitter-base isolation film, 108 denotes a low concentration n-type buried layer (single crystal silicon germanium), 109 denotes a p-type intrinsic base layer (single crystal silicon germanium), 110 denotes a p-type extrinsic base layer (polycrystalline silicon germanium), 111 denotes a low concentration cap layer (single crystal silicon or single crystal silicon germanium), 112 denotes a low concentration polycrystalline silicon (or low concentration polycrystalline silicon germanium), 114 denotes an emitter electrode, 115 denotes an emitter region, 116 denotes an insulator, 117 denotes a high concentration n-type collector contact layer, and 118 denotes an electrode.

In the conventional example 1, n-type impurity ions are diffused thermally from the emitter electrode 114 into the low concentration cap layer 111 to form the emitter region 115. And, the p-type extrinsic base layer 110 formed together with the p-type intrinsic base layer 109 is used for the junction between the p-type intrinsic base layer 109 and the extrinsic base electrode 106.

Figure 3:
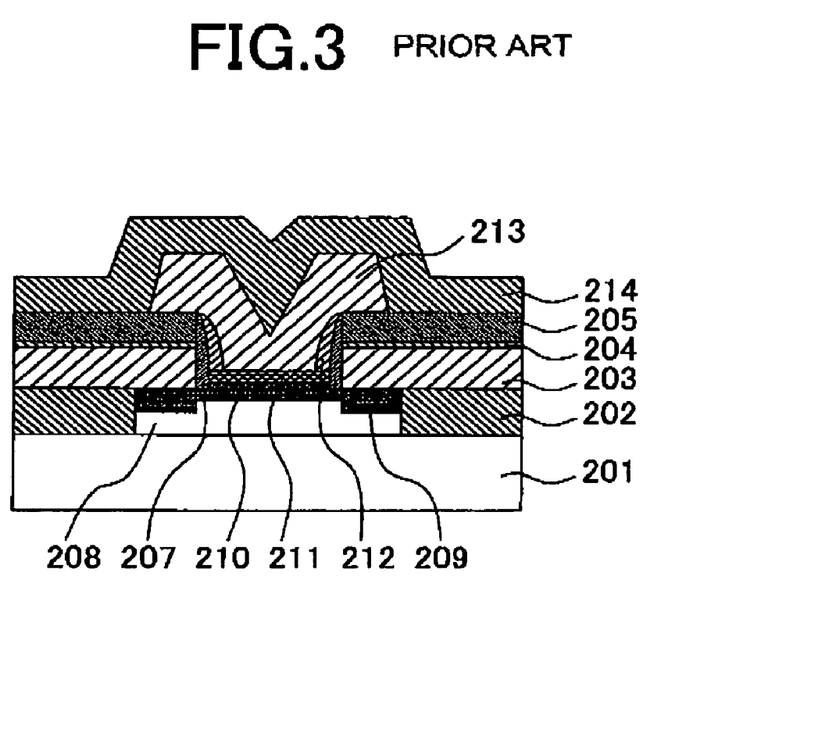
FIG. 3 is a cross sectional view of a bipolar transistor representing a second conventional example.

Another bipolar transistor, which will be described hereinafter as conventional example 2, is disclosed in JP-A 92837/1998. FIG. 3 shows a cross sectional view of the bipolar transistor constituting the conventional example 2. In FIG. 3, reference numerals and symbols are defined as follows; 201 denotes a first N-type silicon layer, 202 denotes a first silicon oxide film, 203 denotes a polycrystalline silicon layer, 204 denotes a second silicon oxide film, 205 denotes a silicon nitride film, 206 denotes an emitter opening, each of 207 and 212 denotes a sidewall, 208 denotes a second N-type silicon layer, 209 denotes an N-type polycrystalline silicon layer, 210 denotes a silicon germanium base layer, 211 denotes a third N-type silicon layer, 213 denotes an N+ polycrystalline silicon layer, and 214 denotes a third silicon oxide layer.

In the conventional example 2, the silicon germanium base layer 210 and the polycrystalline silicon layer 203 that functions as an extrinsic base are connected to each other by the N-type polycrystalline silicon layer 209 formed together with the second N-type silicon layer through thermal diffusion of P-type impurity ions from the polycrystalline silicon layer 203. The third N-type silicon layer that functions as an emitter is selectively formed on the silicon germanium base layer 210 so as to be surrounded by the sidewall 207 after the base layer 210 is formed so as to reach the bottom of the sidewall 207.

To improve the performance of a bipolar transistor, a high cutoff frequency, a low base resistance, and a low base-collector capacitance are required. To raise the cutoff frequency, the base layer film is required to be thin. However, if the base layer film is thin, the base resistance increases and the breakdown voltage goes low. To avoid such problems, it is necessary to raise the concentration of the base layer. If the concentration of the base layer is raised, the concentration of the emitter is lowered with respect to the concentration of the base layer, thereby the current gain of the transistor tends to go down. Recently, to cope with such problems, hetero-bipolar transistors have been used, because they can exhibit an increased current gain by providing a heterojunction between the emitter and the base. The bipolar transistor in the conventional example 1 is structured as a hetero bipolar transistor of this kind. On the other hand, the base-collector capacitance tends to increase due to the employment of high concentration collector layers to speed up the operation of those transistors. Consequently, the junction area is now required to be reduced such as by use of a self-aligned process.

In the bipolar transistor in the conventional example 1, as shown in FIG. 2, the emitter-base isolation film 107a and the film 113 may be thinned and the distance between the intrinsic region and the extrinsic base electrode 106 may be reduced to lower the base resistance. In this structure, the extrinsic base layer 110 is formed so as to extend toward the emitter of the extrinsic base electrode 106 only by the amount of the film thickness from the side end of the emitter. And, if the low concentration cap layer 111 is formed, the low concentration polycrystalline silicon 112 is formed so as to extend toward the emitter by the amount of the film thickness. In addition, because thermal diffusion occurs from the emitter electrode 114 to the low concentration cap film 111 to form the emitter region 115, the emitter region and its periphery are expanded by the depth of the region from the intrinsic region to the extrinsic base. As a result, if the distance between the intrinsic region and the extrinsic base electrode becomes shorter than the sum of the film thickness of the extrinsic base layer, the film thickness of the low concentration cap layer, and the depth of the emitter region, the emitter is formed in the region of the low concentration polycrystalline silicon 112. Therefore, the base current leakage tends to increase due to the recombination. For this reason, to obtain favorable electrical characteristics that are capable of reducing the leakage current with this structure, the distance between the intrinsic region and the extrinsic base electrode had to be wider than the above-described sum. Even when transistors are to be miniaturized more to reduce the base-collector capacitance, a certain distance between the intrinsic region and the extrinsic base electrode is required around the intrinsic region. It has thus been difficult to reduce the components related to the capacitance.

There is another method that may be employed for reducing the base resistance. The method calls for lowering the resistance of the extrinsic base layer 110 for connecting the base layer to the extrinsic base electrode 106. To do this, it is proposed that the concentration of the extrinsic base layer 110 should be raised and the extrinsic base region should be expanded. To raise the concentration of the extrinsic base layer, a method is proposed that raises the temperature or increases the time of the thermal treatment for the extrinsic base layer 110, thereby to accelerate the diffusion of impurity more from the extrinsic base electrode. This method, for the sake of its objective, suffers from a re-distribution of the impurity profile of the intrinsic region, resulting in an impediment to the speedup of the transistor operation. There is another method that increases the contact area between the base layer and the extrinsic base electrode so as to lower the base resistance. This also suffers from an increase in the base-connector junction area, causing the base-collector capacitance to increase.

In FIG. 3 (the conventional example 2), the periphery of the emitter layer 211 is covered by the sidewall 207. The base layer other than the intrinsic base can be reduced in length by thinning the film of this sidewall 207, which is a method of preventing the base current from leaking. However, in this method, for the sake of the manufacturing process, the base layer 210 becomes thinner than the intrinsic region at the bottom of the sidewall 207, causing the sheet resistance of the base layer to increase at that thinner portion. In addition, the method is also structured such that, if the base layer 210 is formed only inside the sidewall 207, impurity ions are diffused from the polycrystalline silicon 203 under a thermal treatment to form a junction between the base layer 210 and the polycrystalline silicon layer 203. However, because a p-type layer is formed deeply in the lower portion of the polycrystalline silicon layer 203, the base-collector capacitance increases and the base layer becomes thick due to heat diffusion. Thinning the base layer to speed up the operation has thus been limited by itself.

As described above, it has been difficult to satisfy the requirements for achieving a high cutoff frequency, a low base resistance, and a low base-collector capacitance at the same time in the conventional structures, using standard manufacturing methods, of semiconductor devices.

SUMMARY OF THE INVENTION

Under such circumstances, it is an object of the present invention to provide a bipolar semiconductor device that is capable of reducing both the base resistance and the base-collector capacitance and of operating at a high cutoff frequency, as well as a method for manufacturing the same.

It is another object of the present invention to provide an optical transmission system that uses a bipolar type semiconductor device that is capable of reducing both the base resistance and the base-collector capacitance, and of operating at a high cutoff frequency.

The aspects of the present invention will be briefly explained as follows.

According to a first aspect of the invention, a semiconductor device is provided, comprising: an emitter region; a collector region; a base region positioned between the emitter region and the collector region; an insulator having an opening; and an extrinsic base region formed so as to be connected to the base region electrically, wherein the base region includes a single crystal base layer; a bottom face of the extrinsic base region is in contact with the insulator; the single crystal base layer is formed in the opening of the insulator; the emitter region includes a high concentration single crystal emitter layer; and the single crystal base layer is formed narrower than the collector region in width.

A second aspect of the invention resides in the semiconductor device which employs the first aspect, wherein: the extrinsic base region may include a second conductivity type single crystal semiconductor region and a second conductivity type polycrystalline semiconductor region; the second conductivity type single crystal semiconductor region may be formed on the base region; and the second conductivity type polycrystalline semiconductor region may be formed on the insulator.

A third aspect of the invention resides in the semiconductor device which employs the second aspect, wherein a silicide layer may be formed on the polycrystalline semiconductor region.

According to a fourth aspect of the invention, a semiconductor device comprises: a first conductivity type first collector region; a first insulator formed on the first collector region and having an opening; a first conductivity type second collector region formed on the first collector region in the opening; a second conductivity type base region formed on the second collector region; a second conductivity type polycrystalline semiconductor base region formed on the first insulator in contact with a side face of the base region; a first conductivity type emitter region formed on the base region in contact with the base region; a second insulator formed in contact with the base region so as to cover the side face of the emitter region; and a second conductivity type extrinsic base region formed on the base region around the second insulator and the polycrystalline semiconductor base region so as to be in contact with those regions, wherein both bottom faces of the emitter region and the second insulator are approximately on the same plane.

A fifth aspect of the invention resides in the semiconductor device which employs the fourth aspect, wherein: the extrinsic base region may include a second conductivity type single crystal semiconductor region and a second conductivity type polycrystalline semiconductor region; the second conductivity type single crystal semiconductor region may be formed on the base region; and the second conductivity type polycrystalline semiconductor region may be formed on the polycrystalline semiconductor region.

A sixth aspect of the invention resides in the semiconductor device which employs the fifth aspect, wherein: a silicide layer may be formed on the polycrystalline semiconductor region.

A seventh aspect of the invention resides in the semiconductor device which employs the sixth aspect, wherein: the first insulator may include upper and lower layers; the upper layer may have a first opening while the lower layer may have a second opening; the second opening may include the first opening, its region being wider than the first opening; and the second collector region may be in contact with a bottom face of the upper layer at the periphery of the first opening.

An eighth aspect of the invention resides in the semiconductor device which employs the seventh aspect, wherein: each of the second collector region and the base region may include single crystal silicon-germanium or single crystal silicon germanium carbon; and the emitter region may include single crystal silicon.

According to a ninth aspect of the invention, a method for manufacturing a semiconductor device comprises the steps of: forming a first insulator on a first conductivity type first collector region; forming an opening in the first insulator to expose part of the surface of the first collector region; forming a first conductivity type second collector region in the opening formed in the surface of the exposed first collector region; forming a second conductivity type base region and a second conductivity type polycrystalline semiconductor base region on the second collector region and the first insulator approximately at the same time; forming a first conductivity type emitter layer on the base region; forming a land-like pattern layer consisting of a single layer or many layers on the emitter layer; etching the emitter layer so as to leave a region where the land-like patterns are formed as they are to expose the etched region and the surface of the polycrystalline semiconductor base region; forming a sidewall consisting of a second insulator on each of a sidewall of each of the land-like pattern layer and the emitter layer; and forming a second conductivity type extrinsic base region and a second conductivity type polycrystalline silicon extrinsic base region on the base region and the polycrystalline silicon base region, using the land-like pattern layer and the sidewall as masks, respectively.

A tenth aspect of the invention resides in the method which employs the ninth aspect, wherein: the step of forming the first insulator may include: a sub-step of forming upper and lower films; a sub-step of forming a first opening in the upper film; and a sub-step of forming a second opening, wider than the first opening, in the lower film, and wherein the step of forming the second collector region may include: a sub-step of enabling a selective epitaxial growth on the surface of the second collector region until the surface of the second collector region comes in contact with the bottom face of the upper film.

According to a eleventh aspect of the invention, a method for manufacturing a semiconductor device comprises: a first step of forming a first insulator having an opening on a first conductivity type first collector region; a second step of forming a first conductivity type second collector region only in the opening formed in the surface of the first collector region through a selective epitaxial growth; a third step of forming a second conductivity type base region and second conductivity type polycrystalline silicon base region on the second collector region and the first insulator respectively through a blanket epitaxial growth approximately at the same time; a fourth step of forming a first conductivity type emitter layer on the base region through a blanket epitaxial growth; a fifth step of forming a land-like pattern layer consisting of a single layer or many layers on the emitter layer; a sixth step of exposing the base region and the surface of the polycrystalline silicon base region under a wet etching method that does not etch second conductivity type semiconductors using the land-like pattern layer as a mask so as to leave only the land-like pattern layer of the emitter layer as it is; a seventh step of depositing a second insulator over the entire object surface to form a sidewall on a sidewall of the land-like pattern layer and the emitter layer respectively with the second insulator under an anisotropic dry etching method; and an eighth step of forming a second conductivity type extrinsic base region and a second conductivity type polycrystalline silicon extrinsic base region on the base region and the polycrystalline silicon base region respectively, through a selective epitaxial growth, using the sidewall formed by the land-like pattern layer and the second insulator as masks.

A twelfth aspect of the invention resides in the method which employs the eleventh aspect; wherein the first step may include a sub-step of forming the first insulator with the upper and lower films, a sub-step of forming a first opening in the upper film, and a sub-step of forming a second opening wider than the first opening in the lower layer; and the second step may include a sub-step of enabling a selective epitaxial growth for the second collector region until the surface thereof comes in contact with the bottom face of the upper layer.

According to a thirteenth aspect of the invention, an optical communication system that includes an optical transmission/receiving system comprises: a photo detector for receiving an optical signal and outputting an electrical signal; a first amplifier circuit for receiving the electrical signal from the photo detector; and a second amplifier circuit for receiving an output from the first amplifier circuit; an identifier for converting an output from the second amplifier circuit to a digital signal synchronously with a predetermined clock signal, wherein the first amplifier circuit includes: a first bipolar transistor having a base connected to the photo detector; and a second bipolar transistor having a base connected to a collector of the first bipolar transistor and a collector connected to an input of the second amplifier circuit; and wherein at least one of the first and second bipolar transistors is configured by the semiconductor device manufactured according to any of the first aspect to eighth aspect.

DETAILED DESCRIPTION OF THE PREFERRED EMBODIMENTS

In a preferred embodiment of the bipolar type semiconductor device of the present invention, the second collector region and the base region are formed only in the opening of the insulator provided on the first collector region. And, an emitter region is formed on part of the base region so that its sidewall is covered by an insulator sidewall, and an extrinsic base is formed on the base region around the insulator sidewall. Furthermore, a polycrystalline silicon base and a polycrystalline silicon extrinsic base electrode are laminated on the insulator. The bottom faces of the emitter and the insulator sidewall around the emitter are approximately on the same plane.

That structure employed for the semiconductor device of the present invention reduces the distance between the emitter region and the extrinsic base region without increasing the leakage current from around the emitter region. The film thickness of the base layer between the emitter region and the extrinsic base region is the same as that of the layer formed under the emitter region. Furthermore, the extrinsic base region that can be transformed into a higher concentration p-type one than the base region can be used for the junction between the base layer and the polycrystalline silicon extrinsic base electrode. Consequently, the base resistance is reduced. If the base layer is thinned any more, the resistance of the junction between the base layer and the polycrystalline silicon extrinsic base electrode increases in any of the structures of the conventional semiconductor devices. In the structure of the semiconductor device of the present invention, however, the resistance of such a junction is suppressed from increasing even when the base layer is thinned more. It is thus possible to form the base layer so that it is thinner than any of the conventional ones, thereby a higher cutoff frequency is obtained.

Furthermore, because the concentration of the extrinsic base is raised and the polycrystalline silicon base is provided, the base resistance is suppressed from increasing even when the extrinsic base region is narrowed. It is thus possible to obtain a narrower base-collector region, thereby the area of the base-collector region is reduced. In addition, because an insulator is formed under the polycrystalline silicon base region around the base region, the collector-base parasitic capacitance is reduced.

Next, preferred embodiments of the semiconductor device and the method for manufacturing the same according to the present invention will be described in detail with reference to the accompanying drawings.

First Embodiment

Figure 1:
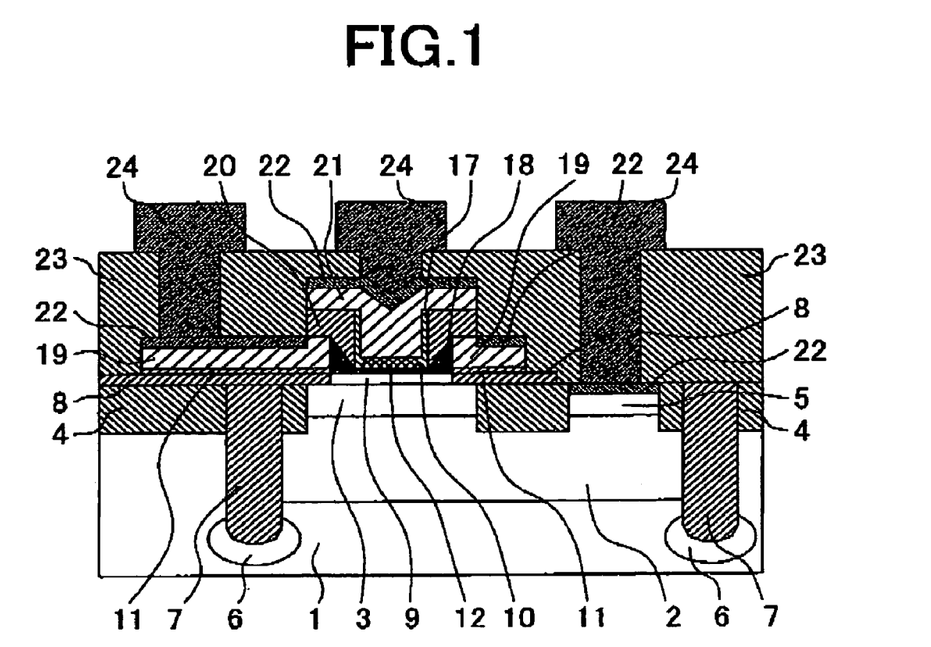
FIG. 1 is a cross sectional view of a semiconductor device representing a first embodiment of the present invention.

FIG. 1 shows a cross sectional view of a semiconductor device representing a first embodiment of the present invention. In FIG. 1, the reference numerals and symbols are defined as follows; 1 denotes a p-type silicon substrate, 2 denotes a high concentration collector buried layer, 3 denotes a low concentration collector layer, each of 4, 7, 8, 20, and 23 denotes a silicon oxide film, 5 denotes a collector contact layer, 6 denotes a p-type diffusion layer, 9 denotes a single crystal silicon collector layer, 10 denotes a single crystal silicon base layer, 11 denotes a polycrystalline silicon base, 12 denotes an emitter region, 17 denotes a silicon oxide film sidewall, 18 denotes an extrinsic base, 19 denotes a polycrystalline silicon extrinsic base electrode, 21 denotes a polycrystalline silicon emitter electrode, 22 denotes a silicide layer, 24 to 26 denote an emitter electrode, a base electrode and a collector electrode, respectively.

Hereinafter, a description will be made for how to manufacture a bipolar semiconductor device structured as shown in FIG. 1, step by step, with reference to FIGS. 3 through 11.

At first, how to form a structure of the bipolar semiconductor shown in FIG. 4 will be described. Arsenic or antimonial n-type impurity ions are injected in the silicon substrate 1 using a photo-resist mask that has exposed a region between a base layer to-be-formed region and a collector region electrode to-be-formed region to form a high concentration n-type collector buried layer 2 in a thermal diffusion process. Then, an n-type low concentration collector layer 3 is formed in a silicon epitaxial growth process. After that, the surface of the low concentration collector layer 3, except for the base layer and the collector electrode region, is treated by the LOCOS method to form a silicon oxide film 4. Otherwise, the low concentration collector layer 3, except for the base layer and the collector electrode region, may be etched by 300 to 400 nm, using the dry-etching method, a silicon oxide film is deposited by the CVD (Chemical Vapor Deposition) method, and a silicon oxide film 4 is buried there by the CMP (Chemical Mechanical Polishing) method to form the silicon oxide film 4.

After that, high concentration phosphor ions are injected only in the collector electrode formed region to cause thermal diffusion to form a collector contact layer 5 there.

Next, a trench of about 3 µm in depth is formed in the silicon oxide film 4 and the silicon substrate 1, respectively, using a photo-resist mask having a trench-like opening of about 0.4 µm in width around the high concentration n-type collector buried layer 2. Then, p-type impurity ions are injected into the bottom face of this trench to form a p-type diffusion layer 6 there. This p-type diffusion layer reduces the leakage current from between transistors. After that, a silicon oxide film 7 that is over the width of the trench is buried in that trench. The silicon oxide film 7 may be deposited over the entire surface of the trench by the CVD method after the surface is subjected to a thin thermal oxidation process. After that, the silicon oxide film 7 is removed by dry-etching or a CMP method from the silicon oxide film 4, the low concentration collector layer 3, and the collector contact layer 5. At that time, the surfaces of the low concentration collector layer 3 and the collector contact layer 5 may be protected by a laminated film consisting of a silicon nitride film and a silicon oxide film from damage, respectively. In that connection, the laminated protection film should be formed over the entire object surface before the trench is formed. If the laminated protection film is removed after removing the surface silicon oxide film 7, the structure shown in FIG. 4 is obtained.

Figure 5:
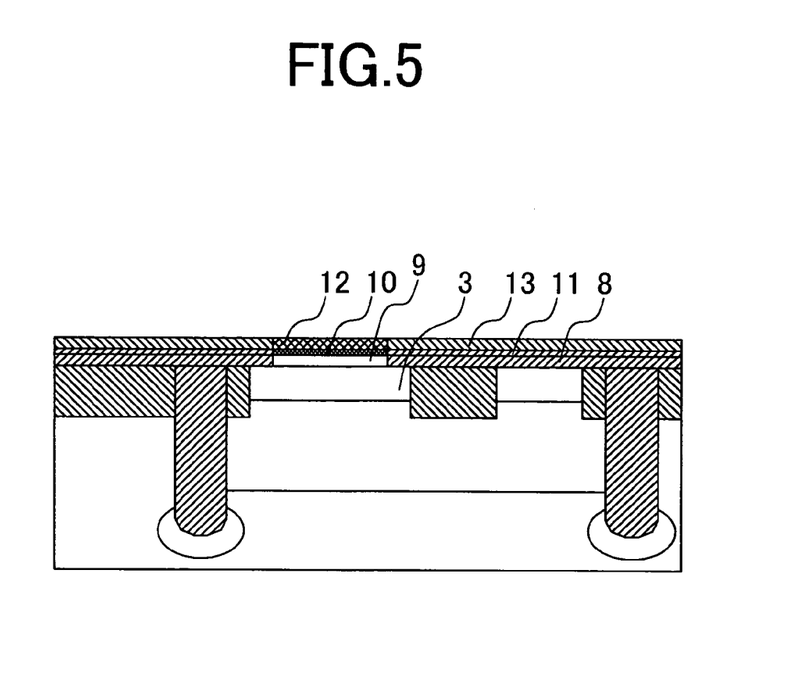
FIG. 5 is a cross sectional view of the semiconductor device as seen at the process step next to the one shown in FIG. 4.

Next, a silicon oxide film 8 is deposited to 30 nm thereon. The thickness of this silicon oxide film should be the same as that of the collector layer that is to be subjected to a selective epitaxial growth process. After that, a photo-resist pattern having an opening narrower than that of the low concentration collector layer 3 is formed on this silicon oxide film 8. Then, the silicon oxide film 8 is removed by means of wet etching. At that time, after the photo-resist pattern is formed, phosphorous ions may be injected into the low concentration collector layer 3 to form an n-type collector region. On the low concentration collector layer 3 in the formed opening, n-type silicon is epitaxial-grown to about 30 nm selectively to form a collector layer 9. Just after that, p-type silicon is epitaxial-grown to about 5 nm selectively over the entire object surface to form a base layer 10 on the collector layer 9 and a polycrystalline silicon base layer 11 on the silicon oxide film 8, respectively. Furthermore, just after this process, an n-type silicon layer of about 15 nm is epitaxial-grown selectively over the entire surface to form an emitter layer 12 on the base layer 10 and an n-type polycrystalline silicon layer 13 on the polycrystalline silicon base layer 11 at the same time. The structure shown in FIG. 5 is thus obtained.

Next, a silicon oxide film 14 is deposited to 10 nm and a polycrystalline silicon film 15 is deposited to 200 nm, and a silicon oxide film 16 is deposited to 50 nm in turn over the entire object surface by the CVD method. At that time, the silicon oxide film 14 should have a higher etching rate with respect to the hydrofluoric acid etching liquid than that of the silicon oxide film 16. After that, a photo-resist pattern region that is narrower than the emitter layer 12 is formed, and both of the silicon oxide film 16 and the polycrystalline silicon 15 are dry-etched to obtain the structure shown in FIG. 6.

Next, the silicon oxide film 14 is side-etched from the polycrystalline silicon pattern 15 using hydrofluoric acid etching liquid. After that, the emitter layer 12 and the n-type polycrystalline silicon layer 13 are etched using a hydrazine or KOH liquid to obtain the structure shown in FIG. 7. Those etching liquids enable the p-type layer to have a selective etching ratio of 50 times or more than that of the n-type layer, so that they can expose the base layer 10 other than the pattern of the silicon oxide film 14, as well as the surface of the polycrystalline silicon base layer 11. At that time, the emitter side face is formed as (111)-oriented Si.

After that, a 20 nm silicon oxide film 17 is formed over the entire object surface, then a silicon oxide film sidewall 17 is formed thereon by means of anisotropic dry-etching. The 20 nm silicon oxide film 17 may be replaced with a laminated film consisting of a 5 nm silicon oxide film and a 20 nm silicon nitride film and the silicon nitride film may be subjected to anisotropic dry-etching to form a sidewall. Then, the 5 nm silicon oxide film is subjected to dry-etching to expose the base layer 10. In that connection, the base layer 10 comes to be protected from damage often caused by the dry-etching when forming a sidewall. After that, a 50 nm high concentration p-type silicon layer is epitaxial-grown selectively to form an extrinsic base layer 18 on the base layer 10 and a polycrystalline silicon extrinsic base electrode 19 on the polycrystalline silicon base layer 11 at the same time to obtain the structure shown in FIG. 8.

While a silicon bipolar transistor is taken as an example here, the collector 9, the base layer 10, the polycrystalline silicon base 11, the extrinsic base, and the polycrystalline silicon extrinsic base electrode may be formed with silicon germanium or silicon germanium carbon single crystal or polycrystalline.

Next, a 200 nm silicon oxide film is formed over the entire object surface, and then the film is polished until the polycrystalline silicon 15 is exposed. Otherwise, a photo-resist opening pattern that is wider than the polycrystalline silicon 15 pattern by about 400 nm is formed, then the pattern is coated with photo-resist and cured, and then the pattern is dry-etched over the entire surface until the polycrystalline silicon 15 is exposed. After that, the polycrystalline silicon 15 is removed, and then the silicon oxide film 14 is removed to obtain the structure shown in FIG. 9.

After that, high concentration n-type polycrystalline silicon 21 is deposited to 150 nm on the object surface to form a photo-resist pattern for covering the range in which an emitter electrode is formed. Then, the polycrystalline silicon 21 and the silicon oxide film 20 are dry-etched to expose the polycrystalline silicon extrinsic base electrode 19 to obtain the structure shown in FIG. 10. The polycrystalline silicon 21 becomes a polycrystalline silicon emitter electrode.

Next, a photo-resist pattern for manufacturing a polycrystalline silicon extrinsic base electrode 19 is formed, and then the pattern is dry-etched to expose the silicon oxide film 8. After that, the silicon oxide film 8 on the collector contact layer 5 is dry-etched using the photo-resist pattern to expose the collector contact layer 5. Furthermore, titanium or cobalt is evaporated over the entire object surface, then heated and washed to form a silicide layer 22 only on the polycrystalline silicon emitter electrode 21, the polycrystalline silicon extrinsic base electrode 19, and the collector contact layer 5 to thereby obtain the structure shown in FIG. 11.

Next, a silicon oxide film 23 is formed over the entire object surface, and then the surface is flattened by the CMP method. Then, the silicon oxide film 23, where each of the emitter electrode, the base electrode, and the collector electrode are formed, is dry-etched using a photo-resist pattern to expose each silicide layer 22. After that, tungsten or aluminum is evaporated over the entire object surface to form a wiring layer, and then the film is dry-etched using wiring pattern photo-resist to obtain the structure of the semiconductor device of this first embodiment as shown in FIG. 1.

In the semiconductor device of this first embodiment the distance between the emitter region and the extrinsic base region can be reduced without increasing the leakage current from around the emitter region. The thickness of the base layer between the emitter region and the extrinsic base region is the same as that provided under the emitter region. Furthermore, the extrinsic base region to be transformed into a higher concentration p-type one than the base region is used for the junction between the base layer and the polycrystalline silicon extrinsic base electrode. Consequently, the base resistance is lowered. Because no thermal diffusion is made to connect the base layer to the extrinsic base electrode and form the emitter region, although it has been made conventionally, the thermal treatment to be required after the base layer forming is reduced. This is why this embodiment can thin the base layer and speed up the operation of the transistor more than conventionally.

Furthermore, because the concentration of the extrinsic base is raised and the polycrystalline silicon base layer is provided, the base resistance is prevented from increasing even when the extrinsic base region is narrow. The extrinsic base region is thus narrowed, thereby the base-collector region area is reduced. Furthermore, because the first insulator is formed under the polycrystalline silicon base layer around the base region, the collector-base parasitic capacitance is reduced.

Furthermore, because the extrinsic base is formed on the single crystal base region through a selective epitaxial growth, it is formed as a single crystal one. The end face of the extrinsic base thus goes along the crystal orientation of (111) or (311) inclined from the end of the second insulator formed on the base region. Consequently, the farther the end face goes upward from the base region face, the more it is separated from the emitter region. The emitter-base capacitance is thus reduced.

Second Embodiment

Figure 12:
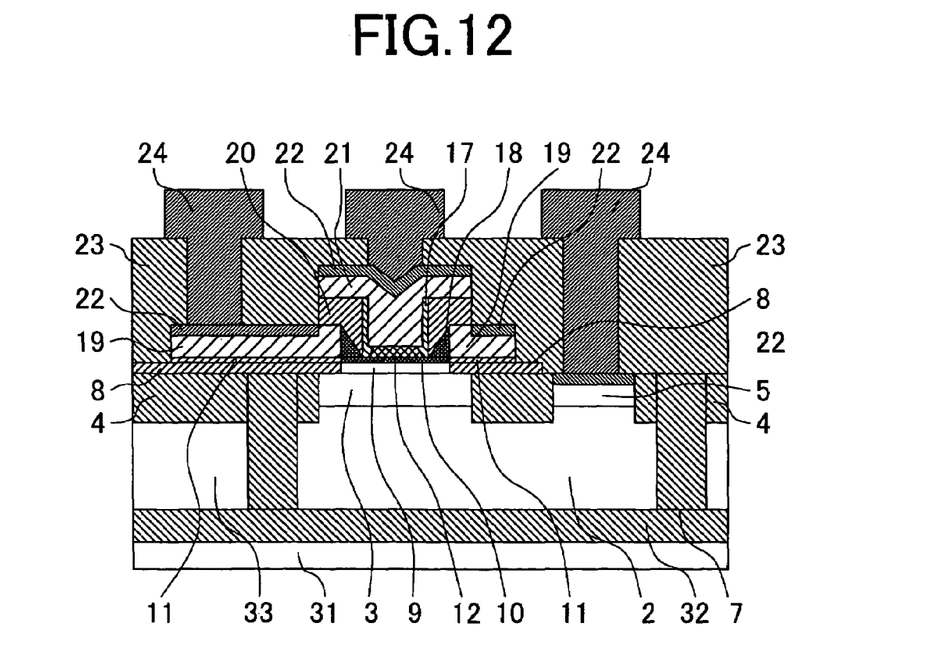
FIG. 12 is a cross sectional view of a semiconductor device representing a second embodiment of the present invention.

FIG. 12 shows a cross sectional view of a semiconductor device representing a second embodiment of the present invention. In FIG. 12, the same numerals/symbols will be used for the same components as those shown in FIG. 1 and redundant description thereof will be omitted. The bipolar semiconductor device of this second embodiment is provided with a base silicon substrate 31, a silicon oxide film 32, and an n-type silicon layer 33. Those are differences from the configuration of the semiconductor device shown in FIG. 1.

Hereunder, a description will be given to indicate how to manufacture the semiconductor device of this second embodiment.

In the method of manufacture of this second embodiment, the substrate to be used first is different from that in the first embodiment. In this second embodiment, a 300 nm silicon oxide film 32 is formed on a base silicon substrate 31, and then a 1000 nm n-type silicon layer is formed thereon. A so-called SOI (Silicon on Insulator) structure is employed for the substrate in this second embodiment. The substrate is then subjected to the processes shown in FIG. 4 through FIG. 11, which denote how to manufacture the semiconductor of the first embodiment, to obtain the structure shown in FIG. 12.

As compared with the first embodiment, the semiconductor device of the second embodiment includes a silicon oxide film formed in between a high concentration collector buried layer and a base silicon substrate. In addition, the trench in the silicon oxide film surrounding the high concentration collector buried layer is shallower than that provided in the first embodiment, enabling the collector-substrate capacitance to be reduced. If the semiconductor device uses a so-called BiCMOS process in which both MOS field effective transistors and bipolar transistors are formed on the same substrate, this second embodiment may mount SOI-structured MOS field effective transistors. Consequently, more functionally enhanced semiconductor circuits are obtained.

Third Embodiment

Figure 13:
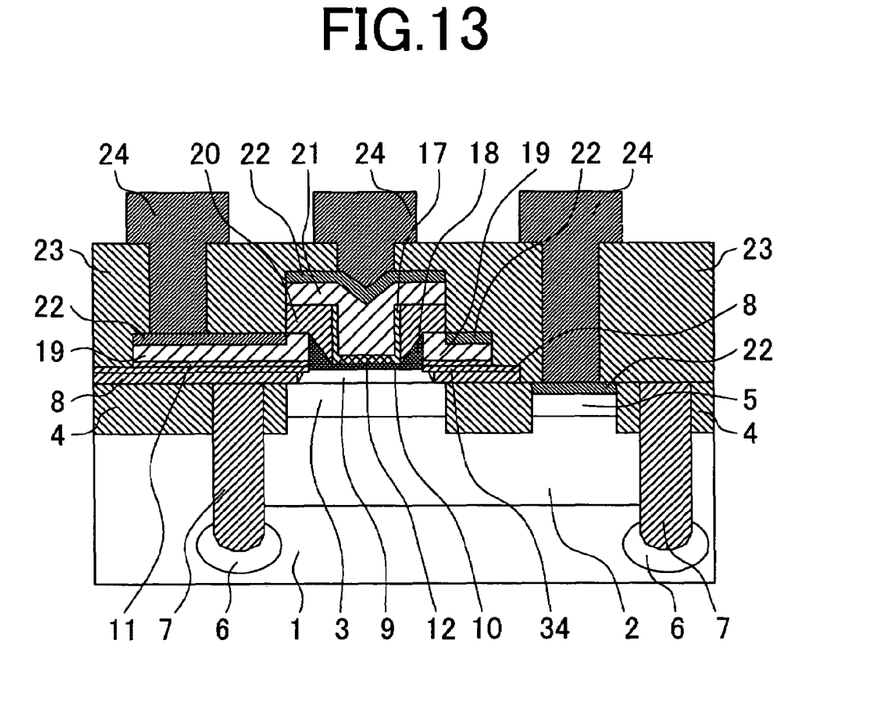
FIG. 13 is a cross sectional view of a semiconductor device representing a third embodiment of the present invention.
Figure 14:
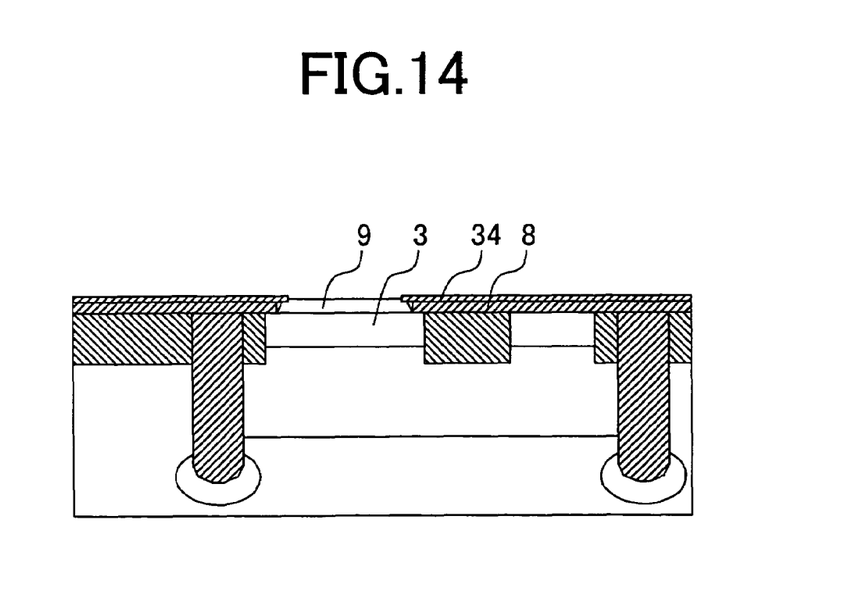
FIG. 14 is a cross sectional view of the semiconductor device as seen in the process step next to the one shown in FIG. 4 in the third embodiment.

FIG. 13 shows a cross sectional view of a semiconductor device representing a third embodiment of the present invention. In FIG. 13, the same numerals/symbols will be used for the same components and a redundant description thereof will be omitted. In the bipolar semiconductor device of this third embodiment, the silicon nitride film 34 is provided. This is a difference from the configuration of the semiconductor device shown in FIG. 1. Hereinafter, a description will be given to indicate how to manufacture the semiconductor device of this third embodiment.

Figure 4:
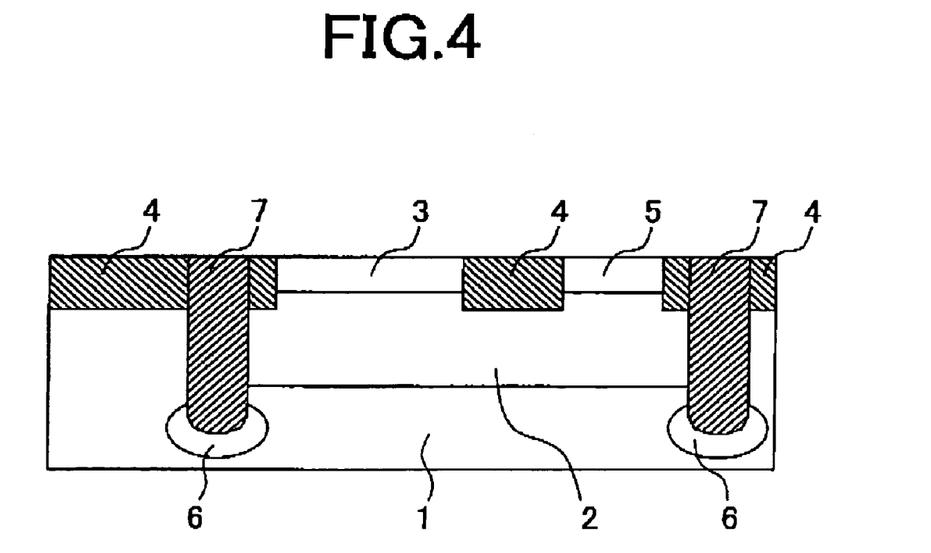
FIG. 4 is a cross sectional view of the semiconductor device shown in FIG. 1 as seen at the first process step of the sequential manufacturing processes.

At first, the structure of the semiconductor device shown in FIG. 4 is obtained according to the manufacturing method described in connection with the first embodiment.

Figure 15:
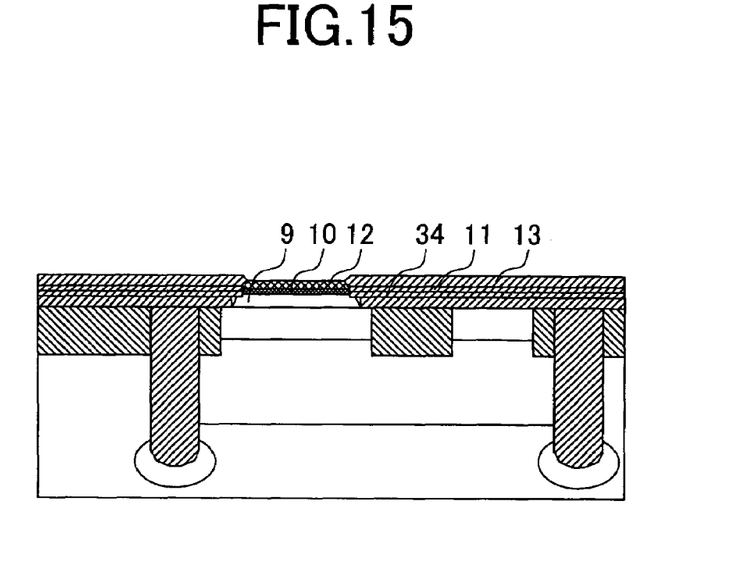
FIG. 15 is a cross sectional view of the semiconductor device as seen in the process step next to the one shown in FIG. 14.

After the structure shown in FIG. 4 is obtained, a 30 nm silicon oxide film 8 and a 15 nm silicon nitride film 34 are deposited. Then, a photo-resist pattern having an opening that is narrower than the low concentration collector layer 3 is formed on the silicon oxide film. The silicon nitride film 34 is subjected to a dry-etching process to remove the photo-resist pattern, and then it is subjected to a wet etching process to etch the silicon oxide film 8 by the film thickness of the silicon oxide film 8 from the opening of the silicon nitride film 34. At that time, after the photo-resist pattern is formed, phosphorous ions may be injected into the low concentration collector layer 3 to form an n-type collector region. After that, a 35 nm n-type silicon layer is epitaxial-grown selectively on the low concentration collector layer 3 in the formed opening to form a collector layer 9. Consequently, most of the facet portion located at the end of the epitaxial-grown crystal, that is apt to be generated in the selective epitaxial growth, is hidden under the silicon nitride film 34. Just after that, p-type silicon is epitaxial-grown selectively to about 5 nm over the entire object surface to form a base layer on the collector layer 9 and a polycrystalline silicon emitter base layer 11 on the silicon nitride film 34 at the same time. Furthermore, just after that, an n-type silicon layer of about 15 nm in thickness is deposited over the entire object surface to form an emitter layer 12 on the base layer 10 and an n-type polycrystalline silicon layer 13 on the polycrystalline silicon emitter base layer 11 at the same time to obtain the structure shown in FIG. 15.

While a silicon bipolar transistor is taken as an example here, the collector layer 9, the base layer 10, the polycrystalline silicon base layer 11, the extrinsic base and the polycrystalline silicon extrinsic base electrode may be formed with single crystal or polycrystalline silicon germanium or silicon germanium carbon.

Figure 6:
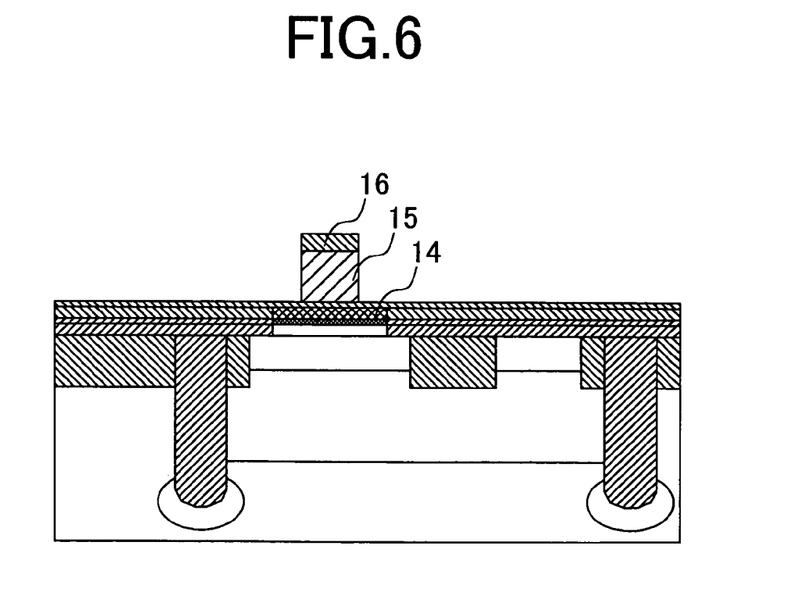
FIG. 6 is a cross sectional view of the semiconductor device as seen at the process step next to the one shown in FIG. 5.
Figure 7:
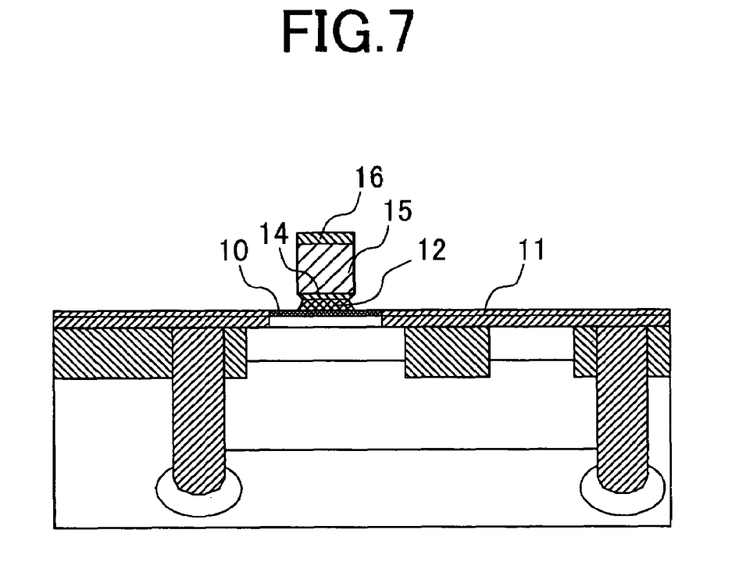
FIG. 7 is a cross sectional view of the semiconductor device as seen at the process step next to the one shown in FIG. 6.
Figure 8:
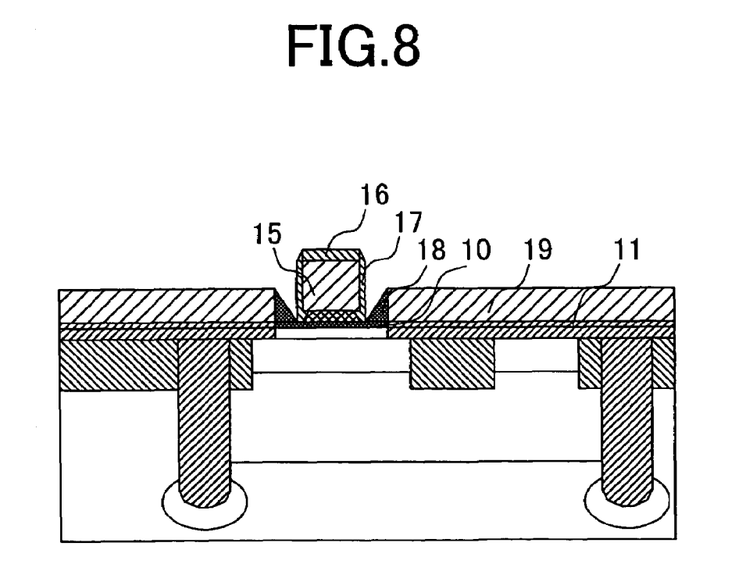
FIG. 8 is a cross sectional view of the semiconductor device as seen at the process step next to the one shown in FIG. 7.
Figure 9:
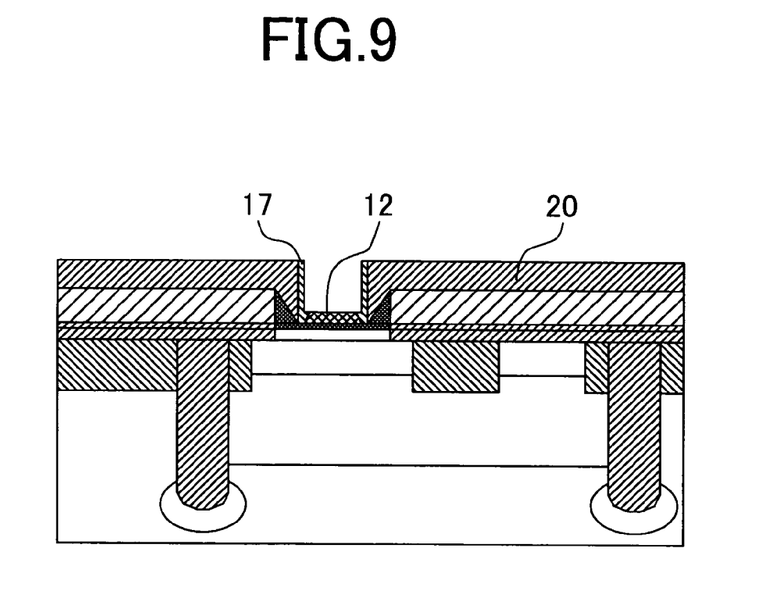
FIG. 9 is a cross sectional view of the semiconductor device as seen at the process step next to the one shown in FIG. 8.
Figure 10:
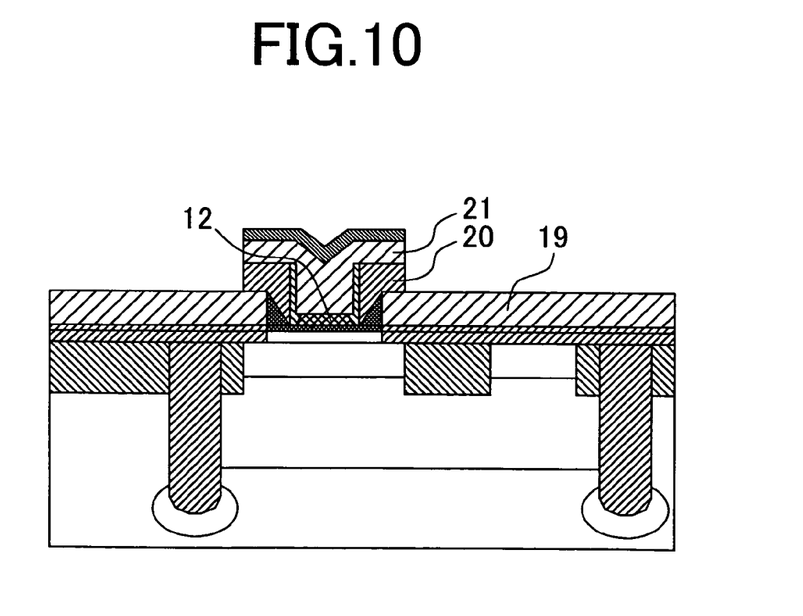
FIG. 10 is a cross sectional view of the semiconductor device as seen at the process step next to the one shown in FIG. 9.
Figure 11:
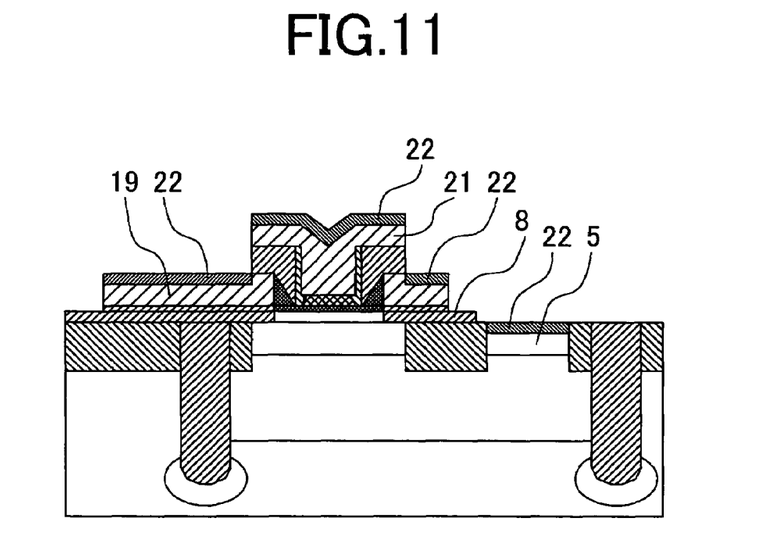
FIG. 11 is a cross sectional view of the semiconductor device as seen at the process step next to the one shown in FIG. 10.

After that, the processes in and after those shown in FIG. 6 for the first embodiment are performed to obtain the structure shown in FIG. 13.

Unlike the first embodiment, the semiconductor device in this third embodiment includes a silicon nitride film 34. This is used to isolate the facet that is apt to be generated at the edge of the collector layer 9 in the selective epitaxial growth process from the base layer. Although such a facet face is often generated at the edge of the silicon oxide film 8 formed on the low concentration collector layer 3, this is because the silicon nitride film 34 is extruded from the silicon oxide film 8. When both the collector layer 9 and the silicon oxide film 8 become the same in thickness, the flat surface of the collector layer 9 comes in contact with the bottom face of the extruded portion of the silicon nitride film 34, thereby the facet face is hidden under the silicon nitride film 34. Because the collector layer 9 is set so as to be thicker than the silicon oxide film 8 even when those films are varied in thickness, the facet face is never exposed. Therefore, the base layer 10 is prevented from falling at the end of the collector layer 9 and the effect of the connection between the base layer 10 and the polycrystalline silicon base layer 11 is improved. The base resistance is thus reduced. It is also possible to prevent the base-collector capacitance from increasing, which occurs when the base layer comes up to the low concentration collector layer 3 at the edge of the collector layer 9.

Fourth Embodiment

Figure 16:
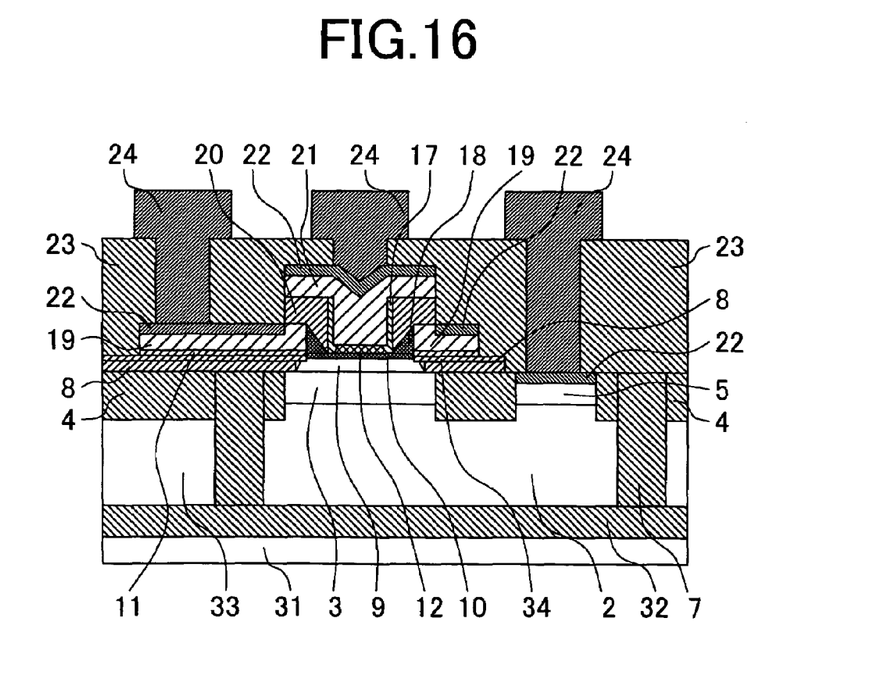
FIG. 16 is a cross sectional view of a semiconductor device representing a fourth embodiment of the present invention.

FIG. 16 shows a cross sectional view of a semiconductor device representing a fourth embodiment of the present invention. In FIG. 16, the same numerals and symbols will be used for the same components as those shown in FIGS. 1 and 13 and a redundant description thereof will be omitted. The semiconductor device of this fourth embodiment is provided with a base silicon substrate 31, a silicon oxide film 32, and an n-type silicon layer 33. This is different from the configuration of the semiconductor device shown in FIG. 13.

Hereinafter, a description will be given to indicate how to manufacture the semiconductor device of this fourth embodiment.

This fourth embodiment differs from the third embodiment by the substrate that is the first item to be used in the manufacturing method. In this fourth embodiment, a 300 nm silicon oxide film 32 is formed on the base silicon substrate 31, and then a 1000 nm n-type silicon layer is formed thereon. The semiconductor device of this fourth embodiment employs a so-called SOI (Silicon on Insulator) structured wafer. After that, the substrate is subjected to the same processes as those used in the third embodiment to obtain the structure shown in FIG. 16.

The semiconductor device of this fourth embodiment includes a silicon oxide film formed between the high concentration collector buried layer and the base silicon substrate, and the trench in the silicon oxide film surrounding the high concentration collector buried layer is shallower than that provided in the third embodiment. Thus, as compared with the third embodiment, the collector-substrate capacitance is reduced in this fourth embodiment. If this fourth embodiment employs a so-called BICOS process in which both MOS field effective transistors and bipolar transistors are formed on the same substrate, the semiconductor device of this fourth embodiment makes it possible to mount SOI structured MOS field effect transistors. As a result, more functionally enhanced semiconductor circuits are obtained.

Fifth Embodiment

Figure 17:
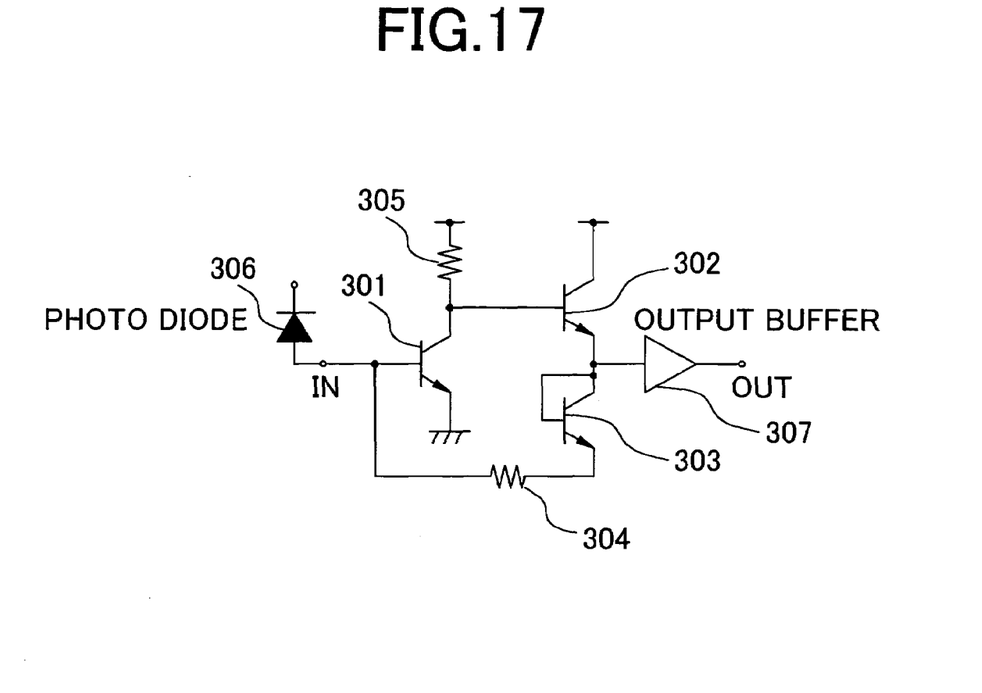
FIG. 17 is a circuit diagram of a semiconductor device in representing a fifth embodiment of the present invention, which is applied to a preamplifier circuit of an optical transmission system.

FIG. 17 shows a circuit diagram of a preset amplifier circuit of an optical transmission system. The amplifier can be enhanced functionally with use of any of the semiconductor devices of the present invention as described with reference to the first to fourth embodiments. As known well, an optical transmission system needs a transmission speed of 10 Gbps or more and its preamplifier circuit is specially required of such fast operations.

In FIG. 17, reference numeral 306 denotes a photo diode, and this photo diode 306 is a photo detector for converting light signals received through an optical transmission cable to electric signals. This preamplifier outputs electric signals inputted to the photo diode 306 or input terminal IN from an output buffer 307 through an amplifier composed of transistors 301 to 303 and resistors 304 and 305.

In this fifth embodiment, a bipolar semiconductor device manufactured according to any of the first to fourth embodiments is used for amplification transistors 301 and 302, as well as for the transistor 303, connected as a level shifting diode, respectively to form a preamplifier having a wide band range over 10 GHz. The diode-connected transistor 303 may not be configured necessarily by any of the transistors described with reference to the first to fourth embodiments; rather, it may be a diode provided with a pn junction.

Sixth Embodiment

Figure 18:
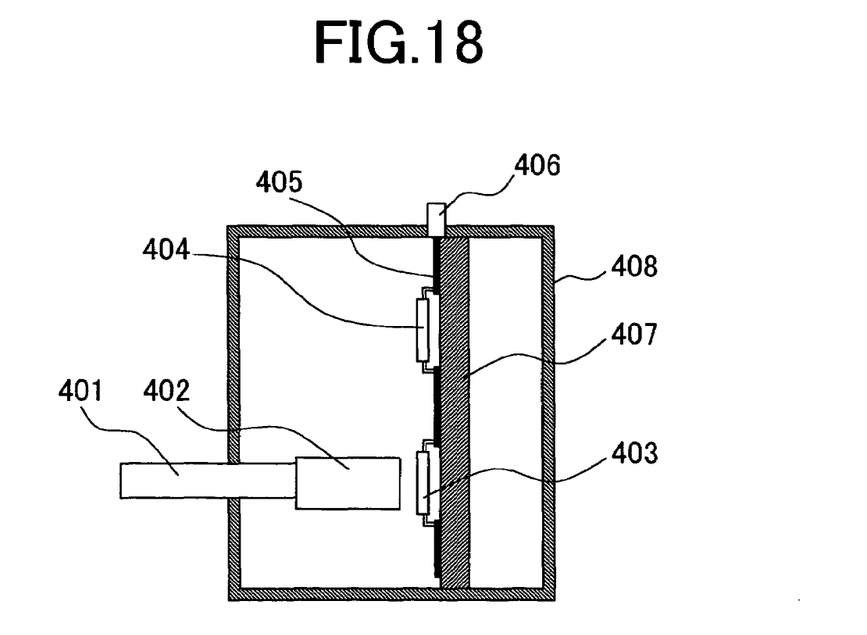
FIG. 18 is a cross sectional view of a front-end module of an optical transmission system of a semiconductor device representing a sixth embodiment of the present invention.

FIG. 18 shows a cross sectional view of a front-end module used for an optical transmission system representing a sixth embodiment of the present invention. In this embodiment, any of the semiconductor devices of the first to fourth embodiments may be combined with the preamplifier in the fifth embodiment into a preamplifier IC used as an integrated circuit chip, which is then applied to a front-end module. In FIG. 18, reference numerals and symbols are defined as follows; 401 denotes an optical fiber, 402 denotes a lens, 403 denotes a photo diode, 404 denotes a preamplifier IC, 405 denotes a wiring for connecting each circuit part to another in the module, 406 denotes an output terminal, 406 denotes an output terminal, 407 denotes a substrate on which such circuit parts as a photo diode, a preamplifier IC, 408 denotes such a sealed package as a metallic case.

Seventh Embodiment

Figure 19:
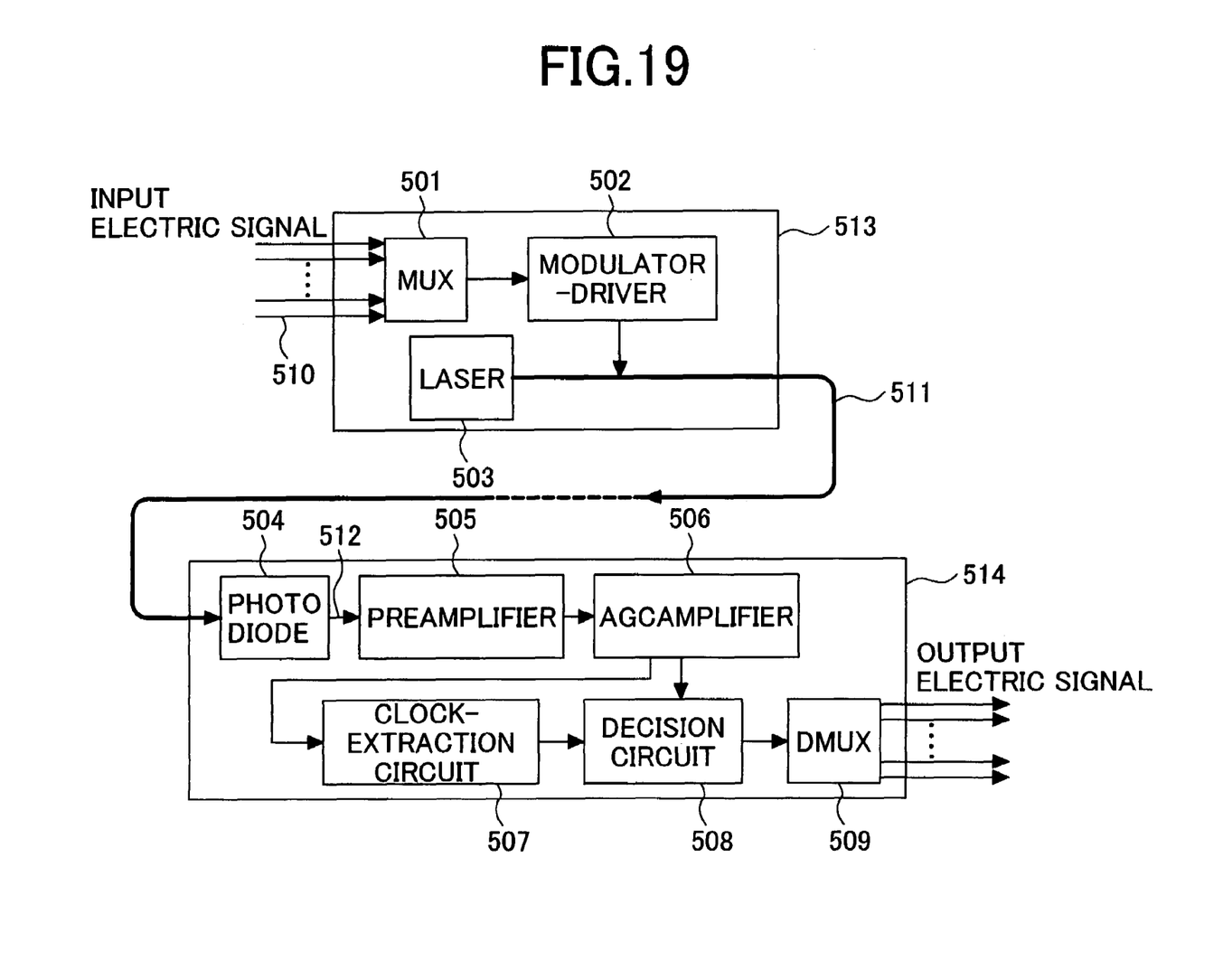
FIG. 19 is a block diagram of an optical transmission system of a semiconductor device according to a seventh embodiment of the present invention.

FIG. 19 shows a block diagram of an optical transmission system representing a seventh embodiment of the present invention. In this seventh embodiment, any of the semiconductor devices of the first to fourth embodiments may be applied to a transmitter 513 that transmits data very fast and a receiver 514 that receives data.

The transmitter 513 is configured by a multiplexer (MUX) 501 for multiplexing a transmission/receiving side electrical signal 510 to, for example, 4:1, a laser 503, and a modulator-driver 502 for modulating/driving a light output from the laser 503 according to a multiplexed signal received from the MUX 501. The output light of the transmitter 513 is transmitted to the receiver 514 through an optical fiber 511.

The transmitted light signal is subjected to an electrical signal by a photo diode 504 of the receiver 514 to become a receiving side electrical signal 512. The electrical signal 512 is amplified by the preamplifier 505 and suppressed from variation caused by the optical transmission distance and the manufacturing variation to be inputted to an automatic-gain-control amplifier (AGC amplifier) 506 that adjusts the gain to fix the output level. The receiving side electrical signal passed through the AGC amplifier 506 is inputted to both of a clock-extraction circuit 507 and a decision circuit 508. The clock-extraction circuit 507 extracts a signal to be assumed as a clock signal for controlling the operation timings of the decision circuit 508 and the 1:4 demultiplexer (DMUX) 509. The receiving side electric signal inputted to the decision circuit 508 through the AGC amplifier 506 is subjected to a single bit analog/digital conversion synchronously with the extracted clock signal, then it is transmitted to the demultiplexer 509 as a digital signal. The demultiplexer 509 demultiplexes the inputted digital signal into 1:4 synchronously with the clock signal, and then it transmits the result to a digital signal processing circuit (not shown) provided in a subsequent step. In the receiver 514 configured so as to operate in such a way, the preamplifier 505 uses a bipolar semiconductor device of any of the first to fourth embodiments of the present invention, as described in connection with the fifth or sixth embodiment.

Because the bipolar semiconductor device of the present invention can operate very fast at a high cutoff frequency and a maximum oscillation frequency of 100 GHz, it can transmit/receive signals as large as 40 G bits/sec very fast.

As described above, according to the present invention, by adopting the semiconductor device and the method for manufacturing the same, it is possible to reduce the distance between the base and the extrinsic base without generating any leakage current from between the emitter and the base. In addition, because the thickness of the base layer between the base and the extrinsic base is not required to be thinned, the base resistance is reduced. Furthermore, because the extrinsic base is provided on the base layer to reduce the base-collection junction area and an insulator is inserted under the extrinsic base electrode, the base-collector capacitance is reduced. Furthermore, the resistance to be generated when the base layer is thinned at the junction between the base layer and the extrinsic base electrode is suppressed from increasing, so that the base layer is thinned and the cutoff frequency is raised. Therefore, the base resistance and the base-collector capacitance are reduced and the bipolar transistor of the present invention can operate at a high cutoff frequency.

When an optical transmission system is configured by circuits using transistors of the present invention, the system comes to be able to transmit/receive high speed optical signals at 40 Gbps, for example.

What is claimed is
1. A semiconductor device comprising:
 a first conductivity type first collector region;
 a first insulator formed on said first collector region and having an opening;
 a first conductivity type second collector region formed on said first collector region in said opening;
 a second conductivity type base region formed on said second collector region;
 a second conductivity type polycrystalline semiconductor extrinsic base region formed on said first insulator;

a first conductivity type emitter region formed on said base region in contact with said base region;

a first conductivity type polycrystalline emitter region formed on said emitter region;

a second insulator formed in contact with said base region so as to cover a side face of said emitter region; and a second conductivity type extrinsic base region having a triangular shape in a cross-sectional view, including a first surface formed on said base region, a second surface in contact with said polycrystalline semiconductor extrinsic base region, and a third inclined surface which contacts the second insulator at a portion of the third inclined surface adjacent to the first surface and the base region and which inclines to be spaced apart from the second insulator as the distance of the third inclined surface from the base region increases, wherein both bottom faces of said emitter region and said second insulator are approximately on the same plane, and wherein a first portion of said second insulator extends under a bottom surface of the polycrystalline emitter region to separate the bottom surface of the polycrystalline emitter region from the base region, wherein a second portion of said second insulator is formed in contact with a side face of said polycrystalline emitter region, and wherein said first and second portions of said second insulator consist of the same material.

2. The semiconductor device according to claim 1;
wherein said second conductivity type extrinsic base semiconductor region is a single crystal region.

3. The semiconductor device according to claim 2;
wherein a silicide layer is formed on said polycrystalline semiconductor extrinsic base region.

4. The semiconductor device according to claim 3;
wherein said first insulator includes upper and lower layers;
wherein said upper layer has a first opening while said lower layer has a second opening;
wherein said second opening includes said first opening, its region being wider than said first opening; and
wherein said second collector region is in contact with a bottom face of said upper layer at the periphery of said first opening.

5. The semiconductor device according to claim 4;
wherein each of said second collector region and said base region includes single crystal silicon-germanium or single crystal silicon germanium carbon; and
wherein said emitter region includes single crystal silicon.

6. The semiconductor device according to claim 1, wherein said second insulator is also formed in contact with a side face of said polycrystalline emitter region.

7. The semiconductor device according to claim 1, wherein said polycrystalline emitter region is comprised of a single layer of polycrystalline silicon and is completely separated from the base region by the second insulator.

8. A semiconductor device comprising:
a first conductivity type first collector region;
a first insulator formed on said first collector region and having an opening;
a first conductivity type second collector region formed on said first collector region in said opening;
a second conductivity type base region formed on said second collector region;
a second conductivity type polycrystalline semiconductor extrinsic base region formed on said first insulator;
a first conductivity type emitter region formed on said base region in contact with said base region;
a first conductivity type polycrystalline emitter region formed on said emitter region;
a second insulator formed in contact with said base region so as to cover a side face of said emitter region; and
means for reducing emitter-base capacitance, said means including a second conductivity type extrinsic base region having a triangular shape in a cross-sectional view, including a first surface formed on said base region, a second surface in contact with said polycrystalline semiconductor extrinsic base region, and a third inclined surface which contacts the second insulator at a portion of the third inclined surface adjacent to the first surface and the base region and which inclines to be spaced apart from the second insulator as the distance of the third inclined surface from the base region increases to thereby decrease capacitance between the polycrystalline emitter region and the second conductivity extrinsic base region by increasing distance therebetween.

* * * * *